(12) United States Patent
Chen et al.

(10) Patent No.: US 9,722,134 B1
(45) Date of Patent: Aug. 1, 2017

(54) METHOD FOR TRANSFERRING SEMICONDUCTOR STRUCTURE

(71) Applicant: MIKRO MESA TECHNOLOGY CO., LTD., Apia (WS)

(72) Inventors: Li-Yi Chen, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/238,706

(22) Filed: Aug. 16, 2016

(51) Int. Cl.
*H01L 21/00* (2006.01)
*H01L 33/00* (2010.01)
*H01L 33/62* (2010.01)

(52) U.S. Cl.
CPC ........ *H01L 33/005* (2013.01); *H01L 33/0008* (2013.01); *H01L 33/0079* (2013.01); *H01L 33/62* (2013.01); *H01L 2933/0033* (2013.01); *H01L 2933/0066* (2013.01)

(58) Field of Classification Search
CPC ......... H01L 33/00; H01L 21/68; H01L 51/00; H01L 21/00; H01L 33/62
USPC .......... 438/26, 27, 46, 34, 455, 464; 257/40, 257/100, E21.499
See application file for complete search history.

(56) References Cited

U.S. PATENT DOCUMENTS

| | | | |
|---|---|---|---|
| 7,163,597 B2 | 1/2007 | Murata et al. | |
| 2004/0168764 A1* | 9/2004 | Anker | H01L 21/67092 156/706 |
| 2006/0279679 A1* | 12/2006 | Fujisawa | G02B 5/0221 349/116 |
| 2007/0000595 A1* | 1/2007 | Prack | B24B 37/30 156/154 |
| 2007/0037364 A1 | 2/2007 | Sugita et al. | |
| 2007/0089857 A1* | 4/2007 | Chiang | B01J 19/0046 165/80.2 |
| 2008/0032425 A1* | 2/2008 | Hillis | G09F 9/30 438/4 |
| 2008/0108171 A1* | 5/2008 | Rogers | B81C 1/0046 438/73 |
| 2009/0199960 A1* | 8/2009 | Nuzzo | B82Y 10/00 156/230 |
| 2010/0317132 A1* | 12/2010 | Rogers | H01L 25/0753 438/27 |

(Continued)

*Primary Examiner* — Sheikh Maruf
(74) *Attorney, Agent, or Firm* — CKC & Partners Co., Ltd.

(57) ABSTRACT

A method for transferring a semiconductor structure is provided. The method includes: coating an adhesive layer onto a carrier substrate; disposing the semiconductor structure onto the adhesive layer, such that the adhesive layer temporarily adheres the semiconductor structure, in which the adhesive layer includes an adhesive component and a surfactant component therein after the disposing; irradiating the electromagnetic wave to the adhesive layer through the carrier substrate to reduce adhesion pressure of the adhesive layer to the semiconductor structure while remaining the semiconductor structure within a predictable position, in which the semiconductor structure has a rejection band or is completely opaque, the carrier substrate has a pass band, and the pass band of the carrier substrate and the rejection band of the semiconductor structure overlaps; and transferring the semiconductor structure from the adhesive layer to a receiving substrate structure after the adhesion pressure of the adhesive layer is reduced.

17 Claims, 5 Drawing Sheets

(56) References Cited

U.S. PATENT DOCUMENTS

| | | | |
|---|---|---|---|
| 2012/0299147 A1* | 11/2012 | Mitani | H01L 21/2007 257/506 |
| 2014/0084240 A1* | 3/2014 | Hu | H01L 25/0753 257/13 |
| 2015/0140729 A1* | 5/2015 | Ferro | G03F 7/2022 438/99 |
| 2015/0165743 A1* | 6/2015 | Horigome | B32B 27/08 156/249 |
| 2015/0269472 A1* | 9/2015 | Finn | B23K 26/361 235/492 |
| 2016/0072067 A1* | 3/2016 | Aritomi | H01L 51/0015 438/26 |
| 2016/0072087 A1* | 3/2016 | Ferro | G03F 7/2022 257/40 |
| 2016/0144608 A1* | 5/2016 | Chang | B32B 37/12 216/83 |

* cited by examiner

METHOD FOR TRANSFERRING SEMICONDUCTOR STRUCTURE

BACKGROUND

Technical Field

The present disclosure relates to a method for transferring at least one semiconductor structure between a growth substrate and a receiving substrate.

Description of Related Art

Electronics packaging technologies is toward further scaling down. The micro-device packaging becomes an important field today and improvements are always desired in any art.

SUMMARY

Traditional technologies for transferring of devices include transfer by wafer bonding from a transfer wafer to a receiving wafer. One such implementation is "direct transfer" involving one bonding step of an array of devices from a transfer wafer to a receiving wafer, followed by removal of the transfer wafer. Another such implementation is "indirect transfer" involving at least two bonding/de-bonding steps. In indirect transfer, a transfer head may pick up an array of devices from a donor substrate, and then bond the array of devices to a receiving substrate, followed by removal of the transfer head.

According to some embodiments of the present disclosure, a method for transferring at least one semiconductor structure is provided. The method includes: coating an adhesive layer onto a carrier substrate; disposing the semiconductor structure onto the adhesive layer, such that the adhesive layer temporarily adheres the semiconductor structure thereto, wherein the adhesive layer comprises at least one adhesive component and at least one surfactant component therein at least after the disposing; irradiating at least one electromagnetic wave to the adhesive layer at least through the carrier substrate to reduce adhesion pressure of the adhesive layer to the semiconductor structure while remaining the semiconductor structure within a predictable position on the adhesive layer, wherein the semiconductor structure has an optical rejection band in between ultraviolet to infrared or is completely opaque, the carrier substrate has an pass bane in between ultraviolet to infrared, and the pass band of the carrier substrate and the rejection band of the semiconductor structure at least partially overlap; and transferring the semiconductor structure from the adhesive layer to a receiving substrate structure after the adhesion pressure of the adhesive layer is reduced.

According to some embodiments of the present disclosure, a micro LED structure is provided. The micro LED structure includes a substrate, at least one conductive pad, at least one micro LED, and at least one surfactant component. The conductive pad is present on the substrate. The micro LED is present on the conductive pad. The surfactant component is present between the conductive pad and the micro LED.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
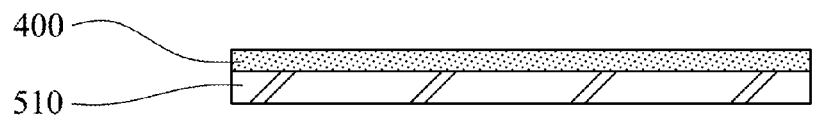
FIGS. 1 to 4 and 6 to 9 are schematic cross-sectional views of intermediate steps in a method for transferring at least one semiconductor structure according to one embodiment of this disclosure.

FIGS. 1 to 4 and 6 to 9 are schematic cross-sectional views of intermediate steps in a method for transferring at least one semiconductor structure 400 according to some embodiments of this disclosure. As shown in FIG. 1, a semiconductor structure 400 is formed on a growth substrate 510. The semiconductor structure 400 is an unchipped semiconductor structure.

Figure 2:
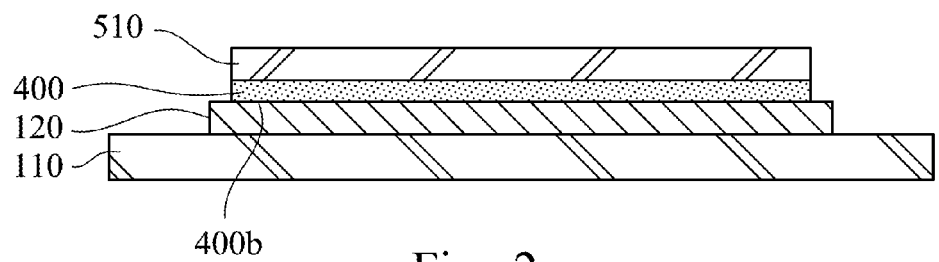

Then, as shown in FIG. 2, an adhesive layer 120 is coated onto a carrier substrate 110, and the semiconductor structure 400 with the growth substrate 510 contacts with the adhesive layer 120, such that the adhesive layer 120 temporarily adheres the semiconductor structure 400 thereto.

In some embodiments, the carrier substrate 110 may be made of glass, polycarbonate (PC), transparent plastic, fused silica, sapphire or transparent ceramic, the like, or any combination thereof.

Specifically, the adhesive layer 120 includes at least one adhesive component and at least one surfactant component therein at least after the semiconductor structures 400 are disposed onto the adhesive layer 120. In some embodiments, the surfactant component is mixed with the adhesive component before the adhesive layer 120 is coated onto the carrier substrate 110. Embodiments of this disclosure are not limited thereto. Other embodiments to add the surfactant component to adhesive layer 120 will be discussed later.

The adhesive component is made of adhesion capable organic. More specifically, the adhesive component is made of epoxy, polymethylmethacrylate (PMMA), polysiloxanes, silicone, the like, or any combination thereof.

In some embodiments, the surfactant component includes, for example, at least one fluorosurfactant component, or, for example, at least one siliconesurfactant component, or, for example, at least one hydrocarbon surfactant component, or the like. Specifically, the surface composition of the fluorosurfactant component includes function group, for example, $-CF_3$ or $-CF_2CF_2-$; the surface composition of the hydrocarbon surfactant component includes, for example, $-CH_3$ or $-CH_2CH_2-$; and the surface composition of the silicone surfactant component includes, for example, $-(Si(CH_3)_2O)_n-$.

The adhesive layer 120 has a thickness in a range from about 40.5 μm to about 100 μm. Adhesion pressure of the adhesive layer 120 to the semiconductor structure 400 is in a range from about 0 atm to about $1 \times 10^3$ atm. The adhesive layer 120 is coated by a spin coater, a slit coater, the like, or any combination thereof.

Figure 3:
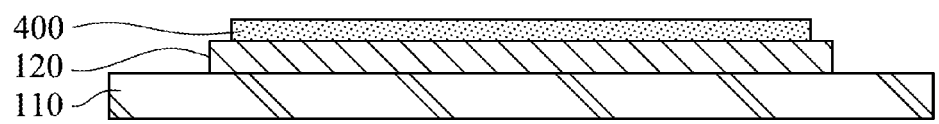

As shown in FIGS. 2 and 3, the growth substrate 510 is removed from the semiconductor structure 400 temporarily adhered to the adhesive layer 120. Specifically, the removing is performed by laser lift-off, chemical lift-off, mechanical lift-off, or any combination thereof. Embodiments of this disclosure are not limited thereto. The removing may be performed by other methods as well.

Figure 4:
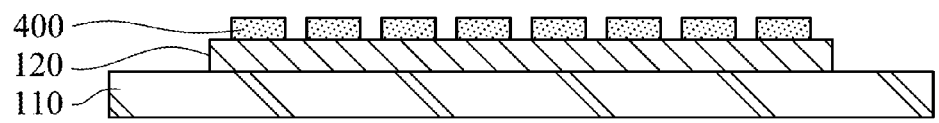

As shown in FIG. 4, the semiconductor structure 400 is chipped to form chipped semiconductor structures 400. The chipping may be performed by chemical dry etching, wet etching, laser, mechanical chipping, or other methods. The chipping may be performed by inductively coupled plasma (ICP), wet etching, or other methods.

Specifically, the chipped semiconductor structures 400 are light emitting diodes (LEDs). More specifically, the chipped semiconductor structures 400 are thin LEDs. The thickness of each of the chipped semiconductor structures 400 may be in a range from about 0.5 μm to about 100 μm. The chipped semiconductor structures 400 may be vertical type LEDs. The cross section area of each of the chipped semiconductor structures 400 may be in a range from about 0.25 μm² to about 1 mm².

Figure 5:
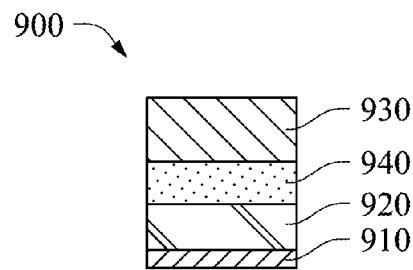
FIG. 5 is a schematic cross-sectional view of a vertical type light emitting diode (LED) according to one embodiment of this disclosure.

FIG. 5 is a schematic cross-sectional view of a vertical type LED 900 according to one embodiment of this disclosure. As shown in FIG. 5, a vertical type LED 900 is provided. The vertical type LED 900 includes a bottom electrode 910, a first semiconductor layer 920, a second semiconductor layer 930, and an active layer 940. The first semiconductor layer 920 is disposed on the bottom electrode 910. The active layer 940 is disposed on the first semiconductor layer 920. The second semiconductor layer 930 is disposed on the active layer 940. In other words, the active layer 940 is disposed between the first semiconductor layer 920 and the second semiconductor layer 930. The active layer 940 is configured to emit light. The second semiconductor layer 930 is configured to be disposed on and electrically connected to a top electrode.

Embodiments of this disclosure are not limited thereto. In some other embodiments, the semiconductor structure 400 may be chipped before the semiconductor structure 400 contacts with the adhesive layer 120.

Figure 6:
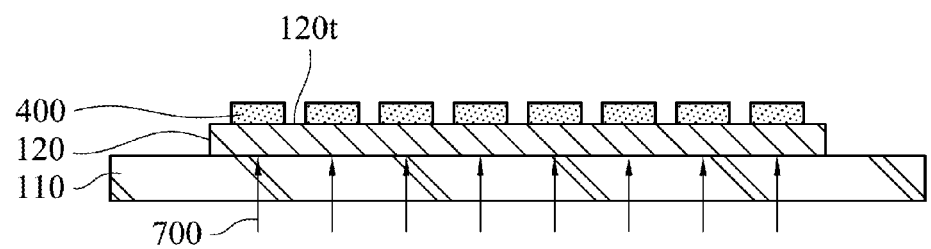

Then, as shown in FIG. 6, at least one electromagnetic wave 700 is irradiates the adhesive layer 120 at least through the carrier substrate 110 to reduce the adhesion pressure of the adhesive layer 120 to each of the semiconductor structures 400 while remaining the semiconductor structures 400 respectively within predictable positions on the adhesive layer 120. Specifically, the reduced adhesion pressure of the adhesive layer 120 to each of the semiconductor structures 400 is times greater than the weight of each of the semiconductor structures 400, and the expansion or shrinking scale during the reducing adhesion pressure could be estimated so that the semiconductor structures 400 respectively remains within the predictable positions on the adhesive layer 120.

Because the electromagnetic wave 700 may not pass through the semiconductor structures 400, the electromagnetic wave 700 is emitted from one side of the carrier substrate 110 opposite to the adhesive layer 120, and then the electromagnetic wave 700 passes through the carrier substrate 110 to the adhesive layer 120.

Specifically, each of the semiconductor structures 400 has an optical rejection band in between ultraviolet to infrared, the carrier substrate 110 has an pass band in between ultraviolet to infrared, and the pass band of the carrier substrate 110 and the rejection band of each of the semiconductor structures 400 at least partially overlap. In some other embodiment, each of the semiconductor structures 400 is completely opaque.

More specifically, the pass band of the carrier substrate 110 is in a range between about 150 nm to about 1800 nm. The rejection band of each of the semiconductor structures 400 is in a range between about 150 nm to about 1800 nm. The electromagnetic wave 700 has a wavelength in a range between about 150 nm to about 1800 nm.

When applying the electromagnetic wave 700 irradiation to the adhesive layer 120, the adhesive component is cross-linked to form a network (cured), and thus the network may push the surfactant component toward the top surface 120t of the adhesive layer facing the semiconductor structures 400.

Specifically, the reduced adhesion pressure of the adhesive layer 120 to each of the semiconductor structures 400 is smaller than the adhesion pressure of the adhesive layer 120 to the carrier substrate 110, which means that the surface energy on the top surface 120t of the adhesive layer 120 facing the semiconductor structures 400 is smaller than the surface energy on a bottom surface of the adhesive layer 120 facing the carrier substrate 110. Therefore, when the adhesive component is cross-linked to become a network, the surfactant component is driven toward the top surface 120t of the adhesive layer facing the semiconductor structure 400, rather than toward the bottom surface of the adhesive layer 120 facing the carrier substrate 110.

In some embodiments, the adhesion pressure of the adhesive layer 120 to each of the semiconductor structures 400 before the adhesion pressure of the adhesive layer 120 is reduced is about 1 atm and the reduced adhesion pressure of the adhesive layer 120 to each of the semiconductor structures 400 is below 0.1 atm.

The adhesive layer 120 has a Young's modulus less than or equal to about 30 GPa before and after the adhesion pressure of the adhesive layer 120 is reduced.

At least one process (for example, a laser lift-off process or a chipping process) is performed on the semiconductor structures 400 temporarily adhered to the adhesive layer 120 before the adhesion pressure of the adhesive layer 120 is reduced. Because of the adhesion pressure of the adhesive layer 120 to each of the semiconductor structures 400, the location of each of the semiconductor structures 400 remains within a predictable position on the adhesive layer 120 during the process, or the relative locations of the semiconductor structures 400 remain respectively within predictable positions on the adhesive layer 120 during the process. In addition, the adhesive layer 120 may function as a buffer layer to absorb external forces (for example, mechanical forces) because of its relative lower Yang's modules coefficient comparing to the chip.

Figure 7:
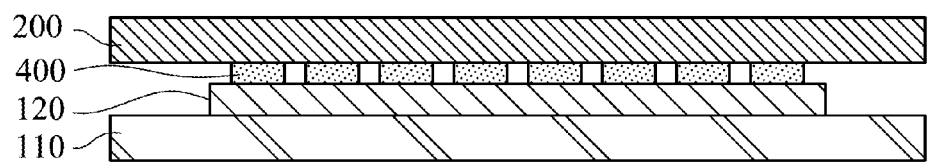

As shown in FIG. 7, a transfer head 200 is positioned over the semiconductor structures 400, and then the semiconductor structures 400 are contacted with the transfer head 200. The adhesive layer 120 deforms to absorb impact force of the transfer head 200 on the semiconductor structures 400 during the contacting.

Figure 8:
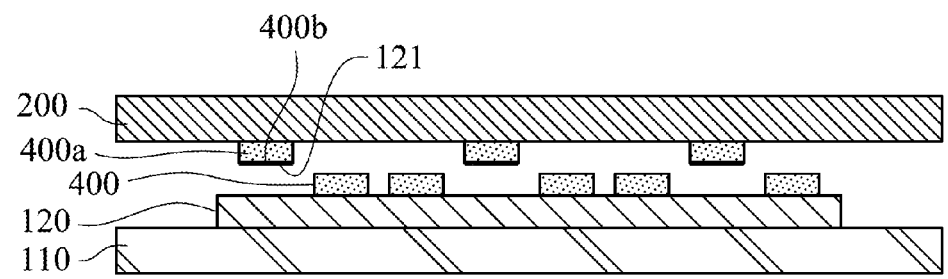

As shown in FIG. 8, the transfer head 200 is actuated to create grip force on a part of the semiconductor structures 400, i.e., the semiconductor structures 400a. Then, the semiconductor structures 400a are picked up with the transfer head 200 from the adhesive layer 120. In some embodiments, the semiconductor structures 400a are transferred to a receiving substrate structure. Embodiments of this disclosure are not limited thereto. In some other embodiments, the semiconductor structures 400a may be damaged devices, and the semiconductor structures 400a are picked up and then discarded.

Specifically, because the adhesive layer 120 includes the surfactant component, the adhesion pressure of the adhesive layer 120 to each of the semiconductor structures 400 can be further reduced after the electromagnetic wave 700 is irradiated to the adhesive layer 120. Therefore, the semiconductor structures 400a are easier to be picked up with the transfer head 200 from the adhesive layer 120.

Figure 9:
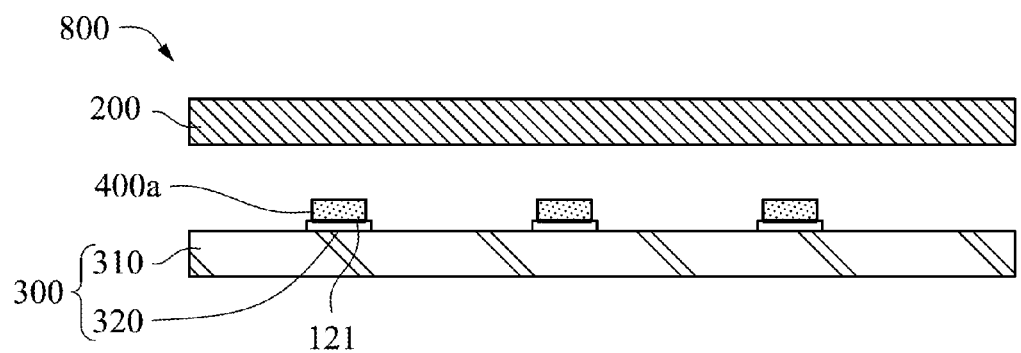

Then, as shown in FIG. 9, the semiconductor structures 400a are released onto a receiving substrate structure 300. Specifically, the semiconductor structures 400a are respectively released onto specific positions of the receiving substrate structure 300, i.e., conductive pads 320 present on a receiving substrate 310.

The grip force of the transfer head 200 is electrostatics force, vacuum force, adhesion pressure, mechanical force, magnetic force, the like, or any combination thereof.

In some embodiments, the receiving substrate structure 300 is an active component array substrate. Therefore, the receiving substrate structure 300 and the semiconductor structures 400a form a display panel. Embodiments of this disclosure are not limited thereto. In some other embodiments, the receiving substrate structure 300 and the semiconductor structures 400a may form a lighting device.

In some embodiments, only the semiconductor structures 400a (a part of the semiconductor structures 400) are transferred to the receiving substrate structure 300. Embodiments of this disclosure are not limited thereto. In some other embodiments, all of the semiconductor structures 400 are transferred to the receiving substrate structure 300.

Because of the adhesion pressure and the buffer function of the adhesive layer 120, the location of each of the semiconductor structures 400 temporarily adhered to the adhesive layer 120 remains within a predictable position during processes, such that the transfer head 200 can be positioned easily over the semiconductor structures 400. In addition, the impact force of the transfer head 200 on the semiconductor structures 400 during the contacting is absorbed by the adhesive layer 120, such that the semiconductor structures 400 are not damaged by the transfer head 200. Therefore, the process yield is increased.

In addition, because the adhesive layer 120 includes the surfactant component, the adhesion pressure of the adhesive layer 120 to each of the semiconductor structures 400 can be further reduced after the electromagnetic wave 700 is irradiated to the adhesive layer 120. Therefore, the semiconductor structures 400 are easier to be picked up with the transfer head 200 from the adhesive layer 120.

As shown in FIG. 9, in some embodiments, the semiconductor structures 400a transferred to the receiving substrate structure 300 are micro light-emitting diodes (LEDs), and thus the semiconductor structures 400a and the receiving substrate structure 300 form a micro LED structure 800. The micro LED structure 800 includes a receiving substrate 310, at least one conductive pad 320, at least one semiconductor structure 400a (i.e. at least one micro LED), and a residual material 121. The conductive pad 320 is present on the receiving substrate 310. The semiconductor structure 400a is present on the conductive pad 320. The residual material 121 is present between the conductive pad 320 and the semiconductor structure 400a. Specifically, the residual material 121 includes at least one surfactant component, which is the residual surfactant component in the adhesive layer 120.

Specifically, the surfactant component may diffuse from the residual material 121 to the conductive pad 320. The concentration of the surfactant component in the conductive pad 320 is the highest at a top surface of the conductive pad 320 facing the semiconductor structure 400a, and the concentration of the surfactant component in the conductive pad 320 decreases as the distance between the measured position and the top surface of the conductive pad 320 facing the semiconductor structure 400a become greater.

In some embodiments, the surfactant component includes, for example, at least one fluorosurfactant component, or, for example, at least one silicone surfactant component, or, for example, at least one hydrocarbon surfactant component, the like or any combination thereof. Specifically, the surface composition of the fluorosurfactant component includes, for example, —$CF_3$ or —$CF_2CF_2$—; the surface composition of the hydrocarbon surfactant component includes, for example, —$CH_3$ or —$CH_2CH_2$—; and the surface composition of the silicone surfactant component includes, for example, —$(Si(CH_3)_2O)_n$—.

The residual material 121 may further include residual adhesive, which is the residual photoreacted adhesive component in the adhesive layer 120.

As shown in FIG. 8, the residual material 121 is present on a bottom surface 400b of the semiconductor structure 400a. When the semiconductor structures 400a are transferred to the receiving substrate structure 300, the residual material 121 with the surfactant component therein can prevent small particles, dust, etc. from contaminating the bottom surface 400b of the semiconductor structure 400a.

Figure 10:
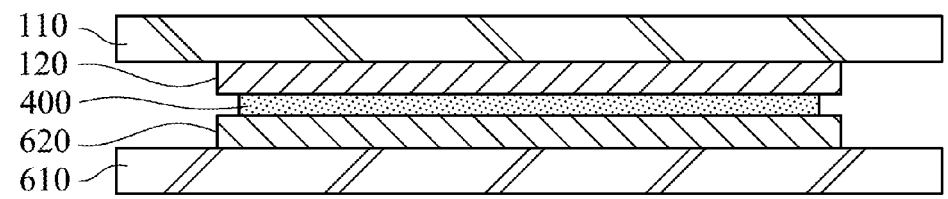
FIGS. 10 and 11 are schematic cross-sectional views of intermediate steps in the method for transferring the semiconductor structures according to another embodiment of this disclosure.
Figure 11:
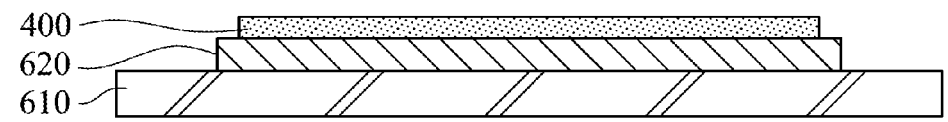

FIGS. 10 and 11 are schematic cross-sectional views of intermediate steps in the method for transferring the semiconductor structure 400 according to some embodiments of this disclosure. As shown in FIG. 3, if the semiconductor structure 400 temporarily adhered to the adhesive layer 120 should be turned upside down, additional operations are performed as shown below.

As shown in FIGS. 3 and 10, an adhesive layer 620 is coated onto a carrier substrate 610. Then, after the adhesion pressure of the adhesive layer 120 to the semiconductor structure 400 is reduced, the semiconductor structure 400 contacts the adhesive layer 620. The adhesive layers 120 and 620 deform to absorb impact forces of the adhesive layers 120 and 620 on the semiconductor structure 400 during the contacting.

Then, as shown in FIG. 11, because of the adhesion pressure of the adhesive layer 620 to the semiconductor structure 400, the adhesive layer 620 temporarily adheres the semiconductor structure 400 thereto, and the adhesive layer 120 with the carrier substrate 110 is removed. The following operations are similar to the aforementioned operations as shown in FIGS. 4 and 6 to 9.

Specifically, the reduced adhesion force of the adhesive layer 120 is greater than the weight of the semiconductor structure 400, such that the semiconductor structure 400 do not escape from the adhesive layer 120 when the adhesive layer 120 is turned upside down or during handling process.

Embodiments of this disclosure are not limited thereto. In other embodiments, before the adhesion pressure of the adhesive layer 120 to the semiconductor structure 400 is reduced, the semiconductor structure 400 contacts the adhesive layer 620. Then, the adhesion pressure of the adhesive layer 120 to the semiconductor structure 400 is reduced.

In some other embodiments, the operations performed in FIG. 10 and FIG. 11 are performed after the semiconductor structure 400 is chipped.

Figure 12:
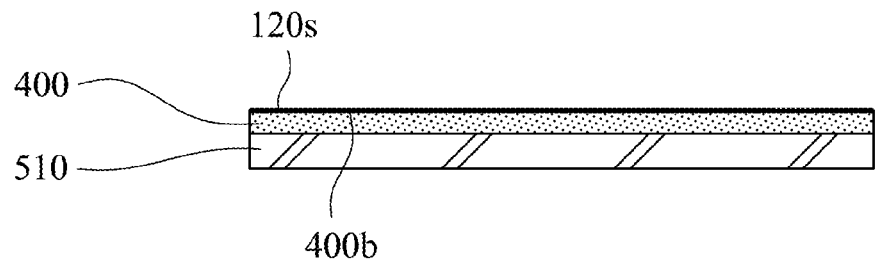
FIG. 12 is a schematic cross-sectional view of an intermediate step in the method for transferring the semiconductor structures according to another embodiment of this disclosure.

FIG. 12 is a schematic cross-sectional view of an intermediate step in the method for transferring the semiconductor structure 400 according to some embodiments of this disclosure. In some embodiments, the surfactant component may be added to the top surface of the adhesive layer 120 indirectly. As shown in FIG. 12, the surfactant component 120s is disposed onto the bottom surface 400b of the semiconductor structure 400 before the semiconductor structure 400 are disposed onto the adhesive layer 120. Then, as shown in FIG. 2, the bottom surface 400b of the semiconductor structure 400 is in contact with the adhesive layer 120 after the semiconductor structure 400 is disposed onto the adhesive layer 120. After the semiconductor structure 400 is disposed onto the adhesive layer 120, the surfactant component 120s is added to the top surface of the adhesive layer 120.

Figure 13:
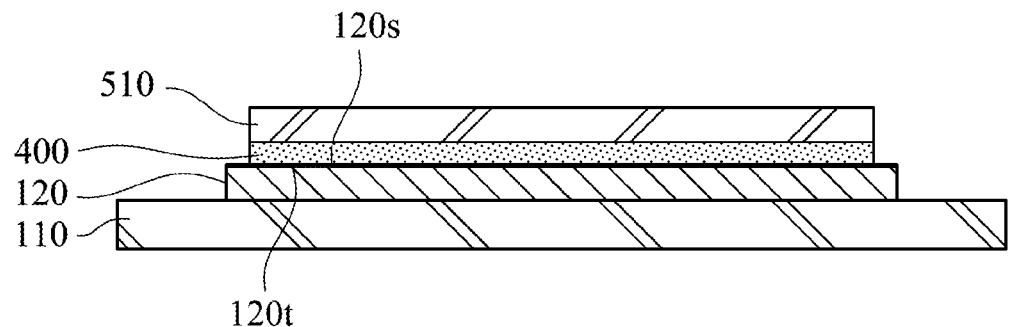
FIG. 13 is a schematic cross-sectional view of an intermediate step in the method for transferring the semiconductor structures according to another embodiment of this disclosure.

FIG. 13 is a schematic cross-sectional view of an intermediate step in the method for transferring the semiconductor structure 400 according to some embodiments of this disclosure. In some embodiments, the surfactant component may be added to the top surface of the adhesive layer 120 directly. As shown in FIG. 13, the surfactant component 120s is disposed onto the top surface 120t of the adhesive layer 120 before the semiconductor structure 400 are disposed onto the adhesive layer 120. That is, the surfactant component 120s is applied to the top surface 120t of the adhesive layer 120 directly before the semiconductor structure 400 are disposed onto the adhesive layer 120. The top surface 120t of the adhesive layer 120 is the surface that is in contact with the semiconductor structure 400 after the semiconductor structure 400 are disposed onto the adhesive layer.

In some embodiments, the adhesive layer 120 coated onto the carrier substrate 110 may have no surfactant component therein, and the surfactant component is added to the top surface of the adhesive layer 120 indirectly (as shown in FIG. 12), directly (as shown in FIG. 13), or both after the adhesive layer 120 is coated onto the carrier substrate 110. However, embodiments of this disclosure are not limited thereto. The aforementioned ways to add the surfactant component to the adhesive layer 120 may be combinable. For example, in some embodiments, the surfactant component and the adhesive component are mixed and coated onto the carrier substrate 110 to form the adhesive layer 120, and then a further surfactant component may be added to the top surface of the adhesive layer 120 indirectly (as shown in FIG. 12), directly (as shown in FIG. 13), or both.

Figure 14A:
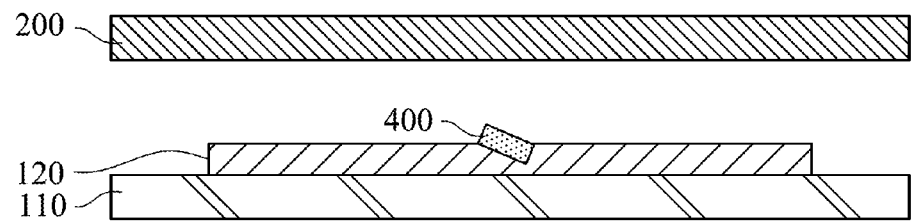
FIG. 14A is a schematic cross-sectional view of an intermediate step when a transfer head is about to contact the semiconductor structure in the method for transferring the semiconductor structure according to one embodiment of this disclosure.
Figure 14B:
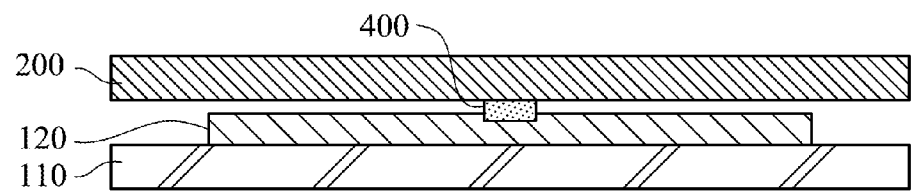
FIG. 14B is a schematic cross-sectional view of an intermediate step when the transfer head contacts the semiconductor structure in the method for transferring the semiconductor structure according to one embodiment of this disclosure.

The adhesive layer 120 has alignment function as well. FIG. 14A is a schematic cross-sectional view of an intermediate step when the transfer head 200 is about to contact the semiconductor structure 400 in the method for transferring the semiconductor structure 400 according to some embodiments of this disclosure. FIG. 14B is a schematic cross-sectional view of an intermediate step when the transfer head 200 contacts the semiconductor structure 400 in the method for transferring the semiconductor structure 400 according to some embodiments of this disclosure. As shown in FIG. 14A, the semiconductor structure 400 temporarily adhered to the adhesive layer 120 may not be level. As shown in FIG. 14B, when the transfer head 200 contacts the semiconductor structure 400, the adhesive layer 120 deforms and levels the semiconductor structure 400 with the transfer head 200, such that the semiconductor structure 400 is aligned with the transfer head 200 and the transfer head 200 can pick up the semiconductor structures 400 easily.

Figure 15A:
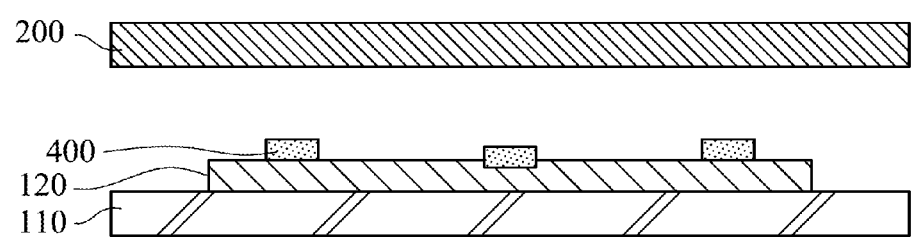
FIG. 15A is a schematic cross-sectional view of an intermediate step when the transfer head is about to contact the semiconductor structures in the method for transferring the semiconductor structures according to one embodiment of this disclosure.
Figure 15B:
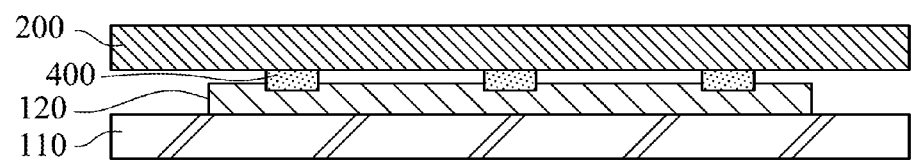
FIG. 15B is a schematic cross-sectional view of an intermediate step when the transfer head contacts the semiconductor structures in the method for transferring the semiconductor structures according to one embodiment of this disclosure.

FIG. 15A is a schematic cross-sectional view of an intermediate step when the transfer head 200 is about to contact the semiconductor structures 400 in the method for transferring the semiconductor structures 400 according to some embodiments of this disclosure. FIG. 15B is a schematic cross-sectional view of an intermediate step when the transfer head 200 contacts the semiconductor structures 400 in the method for transferring the semiconductor structures 400 according to some embodiments of this disclosure. As shown in FIG. 15A, different semiconductor structures 400 may not be disposed at the same height, such that a part of the semiconductor structures 400 disposed at a lower height may not be picked up by the transfer head 200 due to a gap between the part of the semiconductor structures 400 and the transfer head 200. As shown in FIG. 15B, when the transfer head 200 contacts the semiconductor structures 400, the adhesive layer 120 deforms and levels the semiconductor structures 400 with the transfer head 200 to eliminate the gap between the semiconductor structures 400 and the transfer head 200 to maintain the grip force of the transfer head 200, such that the semiconductor structures 400 are aligned with the transfer head 200 and the transfer head 200 is easy to pick up the semiconductor structures 400.

Because of the adhesion pressure and the buffer function of the adhesive layer 120, the location of each of the semiconductor structures 400 temporarily adhered to the adhesive layer 120 is remained in a predictable position during processes, such that the transfer head 200 can be positioned easily over the semiconductor structures 400. In addition, the impact forces of the transfer head 200 on the semiconductor structures 400 during the contacting are absorbed by the adhesive layer 120, such that the semiconductor structures 400 are not damaged by the transfer head 200. Therefore, the process yield is increased.

In addition, because the adhesive layer 120 includes the surfactant component, the adhesion pressure of the adhesive layer 120 to each of the semiconductor structures 400 can be further reduced after the electromagnetic wave 700 is irradiated to the adhesive layer 120. Therefore, the semiconductor structures 400 are easier to be picked up with the transfer head 200 from the adhesive layer 120.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A method for transferring at least one semiconductor structure, the method comprising:
   coating an adhesive layer onto a carrier substrate;
   disposing the semiconductor structure onto the adhesive layer, such that the adhesive layer temporarily adheres the semiconductor structure thereto, wherein the adhesive layer comprises at least one adhesive component and at least one surfactant component at least after the disposing;
   irradiating at least one electromagnetic wave to the adhesive layer at least through the carrier substrate to reduce adhesion pressure of the adhesive layer to the semiconductor structure while remaining the semiconductor structure within a predictable position on the adhesive layer, wherein the semiconductor structure has an optical rejection band in between ultraviolet to infrared or is completely opaque, the carrier substrate has an pass band in between ultraviolet to infrared, and the pass band of the carrier substrate and the rejection band of the semiconductor structure at least partially overlap;
   actuating a transfer head to pick up the semiconductor structure from the adhesive layer after the adhesion pressure of the adhesive layer is reduced; and
   releasing the semiconductor structure from the transfer head onto a receiving substrate structure.

2. The method of claim 1, further comprising:
   mixing the surfactant component with the adhesive component before the coating.

3. The method of claim 1, further comprising:
   disposing the surfactant component onto a bottom surface of the semiconductor structure before the semiconductor structure is disposed onto the adhesive layer, wherein the bottom surface of the semiconductor structure is in contact with the adhesive layer after the semiconductor structure is disposed onto the adhesive layer.

4. The method of claim 1, further comprising:
   disposing the surfactant component onto a top surface of the adhesive layer before the semiconductor structure is disposed onto the adhesive layer, wherein the top surface of the adhesive layer is in contact with the semiconductor structure after the semiconductor structure is disposed onto the adhesive layer.

5. The method of claim 1, wherein the surfactant component comprises at least one fluorosurfactant component, at least one siliconesurfactant component, at least one hydrocarbon surfactant component, or any combination thereof.

6. The method of claim 1, wherein the surfactant component comprises at least one fluorosurfactant component, at least one siliconesurfactant component, or any combination thereof.

7. The method of claim 1, wherein the surfactant component comprises at least one fluorosurfactant component.

8. The method of claim 1, wherein the electromagnetic wave to the adhesive layer drives the surfactant component toward a top surface of the adhesive layer facing the semiconductor structure.

9. The method of claim 1, wherein the pass band of the carrier substrate is in a range between about 150 nm to about 1800 nm.

10. The method of claim 1, wherein the rejection band of the semiconductor structure is in a range between about 150 nm to about 1800 nm.

11. The method of claim 1, wherein the electromagnetic wave has a wavelength in a range between about 150 nm to about 1800 nm.

12. The method of claim 1, further comprising:
    performing at least one process on the semiconductor structure temporarily adhered to the adhesive layer before the adhesion pressure of the adhesive layer is reduced.

13. The method of claim 1, wherein the semiconductor structure is an unchipped semiconductor structure; and
    further comprising:
    chipping the unchipped semiconductor structure temporarily adhered to the adhesive layer before the adhesion pressure of the adhesive layer is reduced.

14. The method of claim 1, wherein the semiconductor structure is a light emitting diode (LED) with a growth substrate thereon; and
    further comprising:
    removing the growth substrate from the LED temporarily adhered to the adhesive layer before the adhesion pressure of the adhesive layer is reduced.

15. The method of claim 1, wherein the reduced adhesion pressure of the adhesive layer to the semiconductor structure is smaller than adhesion pressure of the adhesive layer to the carrier substrate.

16. The method of claim 1, wherein the adhesive layer has a Young's modulus less than or equal to about 30 GPa before and after the adhesion pressure of the adhesive layer is reduced.

17. The method of claim 1, wherein the semiconductor structure is picked up by electrostatics force, vacuum force, magnetic force, or combinations thereof.

* * * * *